(12) United States Patent
Chen (10) Patent No.: US 10,886,315 B2
(45) Date of Patent: Jan. 5, 2021

(54) PHOTOSENSITIVE ASSEMBLY AND FORMATION METHODS THEREOF, LENS MODULE, AND ELECTRONIC DEVICE

(71) Applicant: Ningbo Semiconductor International Corporation, Ningbo (CN)

(72) Inventor: Da Chen, Ningbo (CN)

(73) Assignee: Ningbo Semiconductor International Corporation, Ningbo (CN)

( * ) Notice: Subject to any disclaimer, the term of this patent is extended or adjusted under 35 U.S.C. 154(b) by 0 days.

(21) Appl. No.: 16/225,426

(22) Filed: Dec. 19, 2018

(65) Prior Publication Data
US 2020/0135782 A1   Apr. 30, 2020

Related U.S. Application Data

(63) Continuation of application No. PCT/CN2018/116849, filed on Nov. 22, 2018.

(30) Foreign Application Priority Data

Oct. 31, 2018   (CN) .......................... 2018 1 1288977

(51) Int. Cl.
*H01L 27/146* (2006.01)
*H01L 21/56* (2006.01)
*H01L 23/31* (2006.01)

(52) U.S. Cl.
CPC ........ *H01L 27/14618* (2013.01); *H01L 21/56* (2013.01); *H01L 23/3114* (2013.01); *H01L 27/14627* (2013.01); *H01L 27/14669* (2013.01)

(58) Field of Classification Search
CPC ......... H01L 27/14618; H01L 27/14627; H01L 23/3114; H01L 21/56; H01L 27/14669
(Continued)

(56) References Cited

U.S. PATENT DOCUMENTS

| 7,227,236 B1 | 6/2007 | Lee et al. |
| 7,923,298 B2 * | 4/2011 | Oliver ............... H01L 27/14618 438/114 |

(Continued)

FOREIGN PATENT DOCUMENTS

| CN | 102902136 A | 1/2013 |
| CN | 204424256 U | 6/2015 |

(Continued)

*Primary Examiner* — Vu A Vu
(74) *Attorney, Agent, or Firm* — Anova Law Group, PLLC (57) ABSTRACT

The present disclosure provides a photosensitive assembly and formation method thereof, a lens module, and an electronic device. The method for forming the photosensitive assembly includes providing a transparent cover plate; providing a photosensitive chip, including a photosensitive region and a peripheral region surrounding the photosensitive region; bonding the transparent cover plate to the photosensitive chip through a bonding layer, the bonding layer located in the peripheral region of the photosensitive chip, and the transparent cover plate, the bonding layer, and the photosensitive chip enclosing a cavity that accommodates the photosensitive region; and forming a sealing layer to at least cover the sidewall of the bonding layer and the sidewall of the transparent cover plate. According to the present disclosure, a sealing layer is formed on the sidewall of the bonding layer and the sidewall of the transparent cover plate to increase the effect for sealing the cavity. In a subsequent packaging process, the sealing layer may prevent liquid, e.g. water, from entering the cavity, thereby improving the waterproof ability of the photosensitive assembly, and thus improving the reliability of the lens module.

20 Claims, 6 Drawing Sheets

(58) Field of Classification Search
USPC .......................................................... 257/432
See application file for complete search history.

(56) References Cited

U.S. PATENT DOCUMENTS

| | | | | |
|---|---|---|---|---|
| 8,008,762 | B2* | 8/2011 | Bolken ................... | H01L 21/50 |
| | | | | 257/680 |
| 9,905,597 | B2* | 2/2018 | Yang ..................... | H01L 33/483 |
| 2011/0248367 | A1 | 10/2011 | Yang et al. | |
| 2015/0372203 | A1* | 12/2015 | Eibl ........................ | H04L 33/44 |
| | | | | 257/98 |
| 2017/0365632 | A1* | 12/2017 | Tu ..................... | H01L 27/14618 |

FOREIGN PATENT DOCUMENTS

| | | |
|---|---|---|
| CN | 103560138 B | 1/2016 |
| TW | 201123368 A | 7/2011 |

* cited by examiner

FIG. 20

PHOTOSENSITIVE ASSEMBLY AND FORMATION METHODS THEREOF, LENS MODULE, AND ELECTRONIC DEVICE

FIELD OF THE DISCLOSURE

The present disclosure generally relates to the field of semiconductor manufacturing and, more particularly, relates to a photosensitive assembly and formation method thereof, a lens module, and an electronic device.

BACKGROUND

The continuous improvement of the living standards leads to more and more diversified activities in people's after-work life. Taking pictures has gradually become a common way for people to record their travel as well as their various daily activities. Therefore, electronic devices (such as mobile phones, tablets, cameras, etc.) with picture-capturing functions are increasingly used in people's daily life and work. Today, electronic devices with picture-shooting functions have become indispensable tools for people.

Electronic devices with picture-capturing functions are usually equipped with lens modules. The design level of the lens modules is one of the important factors for determining the quality of the captured pictures and videos. A lens module usually includes a photosensitive assembly containing a photosensitive chip, and a lens assembly fixed above the photosensitive assembly and configured to create an image of the subject to be captured.

BRIEF SUMMARY OF THE DISCLOSURE

The problem solved by the embodiments of the present disclosure is to provide a photosensitive assembly and its formation method, a lens module, and an electronic device to improve the reliability of the lens module.

To solve the above problem, the embodiments of the present disclosure provide a method for forming a photosensitive assembly, including: providing a transparent cover plate; providing a photosensitive chip, which includes photosensitive region and a peripheral region surrounding the photosensitive region; bonding the transparent cover plate to the photosensitive chip through a bonding layer, the bonding layer located in the peripheral region of the photosensitive chip, and the transparent cover plate, the bonding layer, and the photosensitive chip together enclosing a cavity that accommodates the photosensitive region; and forming a sealing layer to at least cover the sidewall of the bonding layer and the sidewall of the transparent cover plate.

Correspondingly, the embodiments of the present disclosure also provide a photosensitive assembly, including: a photosensitive chip, including a photosensitive region and a peripheral region surrounding the photosensitive region; a transparent cover plate, attached to the photosensitive chip through a bonding layer, the bonding layer located in the peripheral region of the photosensitive chip, and the transparent cover plate, the bonding layer, and the photosensitive chip together enclosing a cavity that accommodates the photosensitive region; and a sealing layer, covering at least the sidewall of the bonding layer and the sidewall of the transparent cover plate.

Correspondingly, the embodiments of the present disclosure also provide a lens module, including a photosensitive assembly according the present disclosure.

Correspondingly, the embodiments of the present disclosure also provide an electronic device, including a lens module according to the present disclosure.

As compared to existing technology, the technical schemes according to the embodiments of the present disclosure demonstrate the following advantages:

According to the embodiments of the present disclosure, after the transparent cover plate is attached to the photosensitive chip through a bonding layer, a sealing layer covering at least the sidewall of the bonding layer and the sidewall of the transparent cover plate is formed; the sealing layer is beneficial to improving the effect for sealing the cavity. In a subsequent packaging process, liquid, e.g. water, is prevented from entering the cavity through the contact interface between the bonding layer and the photosensitive chip and/or through the contact interface between the bonding layer and the transparent cover plate. As such, the waterproof performance of the photosensitive assembly may be improved. Correspondingly, the reliability and the yield of the subsequent packaging process may be improved, which in turn may improve the reliability of the lens module.

According to some embodiments, the sealing layer conformally covers the top and the sidewall of the transparent cover plate, the sidewall of the bonding layer, as well as the photosensitive chip exposed by the transparent cover plate. The sealing layer may also be able to prevent the top of the transparent cover plate from contacting liquid, e.g. water, during a subsequent packaging process, and play a role in isolating particles, which may be conducive to securing the optical performance of the transparent cover plate. Moreover, an extra process for removing the sealing layer from other regions may be avoided, and thus the process steps may be simplified.

According to some embodiments, the sealing layer is light transmissive. When the sealing layer also covers the top of the transparent cover plate, while ensuring the waterproof ability of the photosensitive assembly, the sealing layer may be able to prevent undesired influence on the optical performance of the transparent cover plate. As such, the reliability of the lens module may be further ensured.

DETAILED DESCRIPTION

With the development of camera technology, an infrared filter (infrared filter, IR filter) between a photosensitive chip and a lens has been widely used. The infrared filter is used to filter out unnecessary light (for example: infrared light), thereby preventing the image sensor from generating false colors, ripples, or other problems, and thus conducive to improving image resolution and color reproduction. The infrared filter in the conventional lens modules is fixed in the groove of a voice coil motor holder (VCM holder), and then assembled on a circuit board, so that a sealed space is enclosed by the VCM holder, the IR filter, and the circuit board, and the photosensitive chip is then arranged in the sealed space.

With the market trend and the market competition of miniaturization in the semiconductor industry, there have being increasing requirements on the packaging of lens modules. Therefore, in order to further meet the demands of miniaturization and thinning, currently, an IR filter is directly mounted on the photosensitive chip instead of using a VCM holder to fix the IR filter. As such, the overall thickness of the lens module can be reduced.

Figure 1:
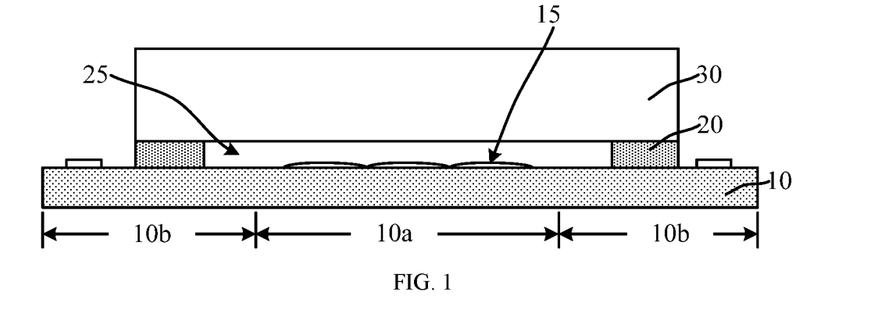
FIG. 1 illustrates a schematic structural view of a photosensitive assembly.

However, after an IR filter is mounted on the photosensitive chip, the reliability of the lens module may be easily reduced. The reason why the reliability of the lens module needs to be improved is now provided with reference to a photosensitive assembly. Referring to FIG. 1, which illustrates a schematic structural view of a photosensitive assembly.

The photosensitive assembly includes a photosensitive chip 10, including a photosensitive region 10*a* and a peripheral region 10*b* surrounding the photosensitive region 10*a*. The photosensitive chip may have a photosensitive functional surface 15 located in the photosensitive region 10*a*. The photosensitive assembly also includes a transparent cover plate 30 located above the photosensitive functional surface 15. The transparent cover plate 30 is attached on the photosensitive chip 10 through a bonding layer 20. The bonding layer 20 is located in the peripheral region 10*b*, and the bonding layer 20, the photosensitive chip 10, and the transparent cover plate 30 together enclose a cavity 25 that accommodates the photosensitive region 10*a*.

After the transparent cover plate 30 is attached to the photosensitive chip 10 through the bonding layer 20, the distance between the transparent cover plate 30 and the photosensitive chip 10 is significantly reduced, and thus the overall thickness of the lens module is substantially reduced.

However, the bonding layer 20 may have undesired performance in sealing the cavity 25, and during a subsequent packaging process, liquid, e.g. water, can easily pass through the contact interface between the bonding layer 20 and the photosensitive chip 10 and/or through the contact interface between the bonding layer 20 and the transparent cover plate 30 to enter the cavity 25. Since the photosensitive region 10*a* of the photosensitive chip 10 is located in the cavity 25, the reliability of the lens module may be easily reduced.

In order to solve the technical problem described above, according to the present disclosure, after a bonding layer is used to attach the transparent cover plate to the photosensitive chip, a sealing layer is formed to at least cover the sidewall surfaces of the bonding layer as well as the sidewall surfaces of the transparent cover plate. The sealing layer can improve the effect for sealing the cavity and also prevent liquid, e.g. water, from entering the cavity, such that the waterproof performance of the photosensitive assembly can be improved, which may further improve the reliability of the lens module.

In the following, in order to make the objects, features, and advantages described above more apparent, various embodiments of the present disclosure will be described in detail with reference to the accompanying drawings.

FIGS. 2-16 illustrate schematic cross-sectional views of structures at certain stages of the exemplary method.

Figure 2:
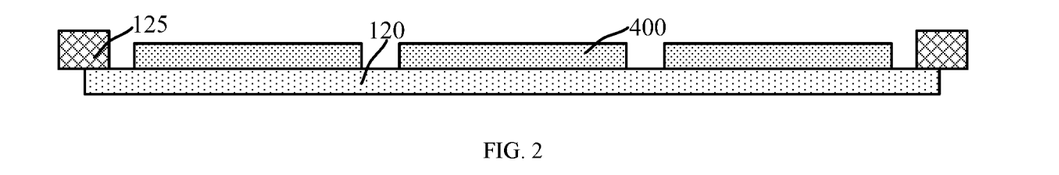
FIGS. 2-16 illustrate schematic cross-sectional views of structures at certain stages of an exemplary method for forming a photosensitive assembly according to various embodiments of the present disclosure.
Figure 3:
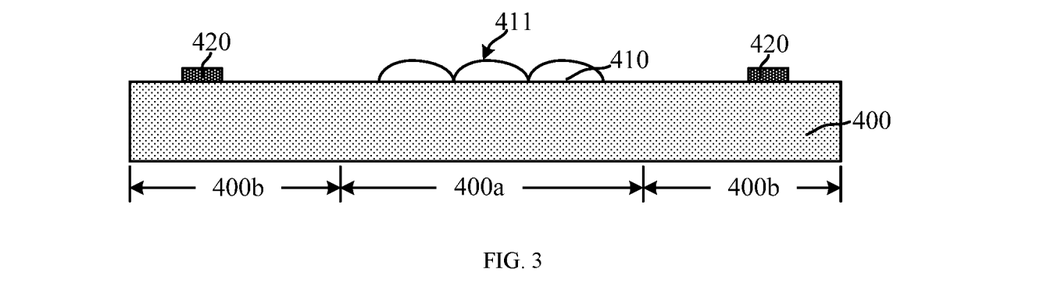

Referring to FIGS. 2-3, where FIG. 3 shows an enlarged view of a photosensitive chip shown in FIG. 2, a photosensitive chip 400 includes a photosensitive region 400*a* (referring to FIG. 3) and a peripheral region 400*b* (referring to FIG. 3) surrounding the photosensitive region 400*a*.

The photosensitive chip 400 may be an image sensor chip. In one embodiment, the image sensor chip is a complementary metal-oxide-semiconductor (CMOS) image sensor (CIS) chip. In other embodiments, the image sensor chip may be a charge coupled device (CCD) image sensor chip. For this reason, in one embodiment, the photosensitive chip 400 may have a photosensitive functional surface 411 located in the photosensitive region 400*a*.

It should be noted that the photosensitive chip 400 may include a plurality of pixel units, for example, a plurality of red pixel units, a plurality of green pixel units, and a plurality of blue pixel units. Therefore, the photosensitive chip 400 may include a plurality of semiconductor photosensitive devices (not shown) and a plurality of filter films (not shown) disposed on the plurality of semiconductor photosensitive devices. The plurality of filter films may be used for selectively absorbing and transmitting the optical signals received by the photosensitive functional surface 411.

In one embodiment, the photosensitive chip 400 may also include a plurality of microlenses 410 (referring to FIG. 3) disposed on the plurality of filter films. The plurality of microlenses 410 may have a one-on-one correspondence with the plurality of semiconductor photosensitive devices, such that the received light beams for generating optical radiation signals may be focused onto the plurality of semiconductor photosensitive devices. Correspondingly, the photosensitive functional surface 411 may be the top surface of the plurality of microlenses 410.

It should be also noted that a plurality of soldering pads 420 may be formed in the peripheral region 400*b*. The plurality of soldering pads 420 may be used to electrically connect the photosensitive chip 400 to external circuits. During a packaging process of the lens module, the photosensitive chip 400 may be directly pasted on a circuit board (for example, a printed circuit board: PCB), and then through wire bonding, electrical connection between the soldering pads 420 and the circuit board may be achieved. Further, a lens assembly may be disposed on the circuit board to form a lens module. As such, packaging of the photosensitive chip 400 may be implemented through the chip on board (COB) packaging technology, which may not only be conducive to improving the reliability and the yield of the packaging process, but also facilitate the reduction of the volume of the formed lens module.

Figure 4:
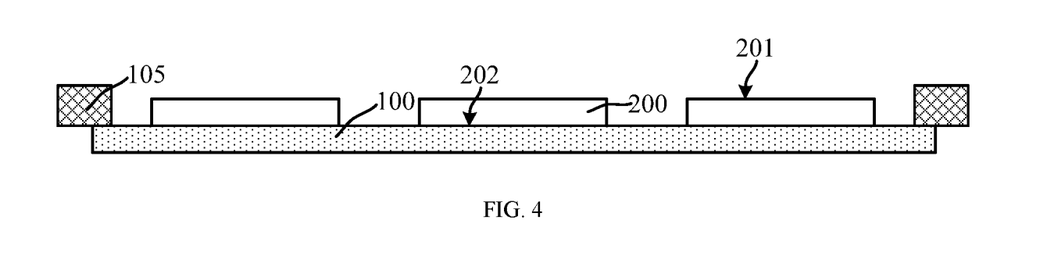
Figure 5:
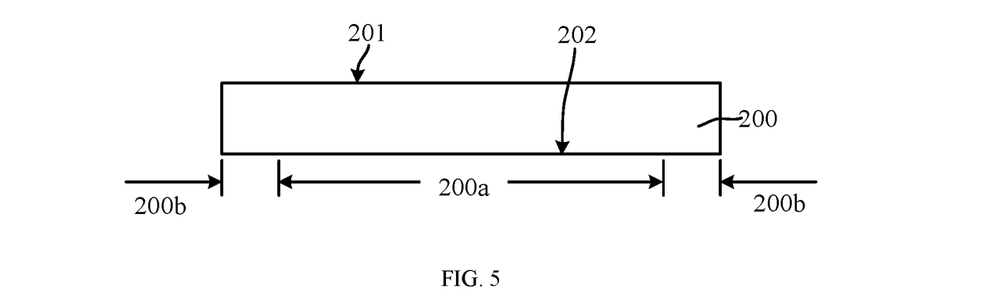
Figure 7:
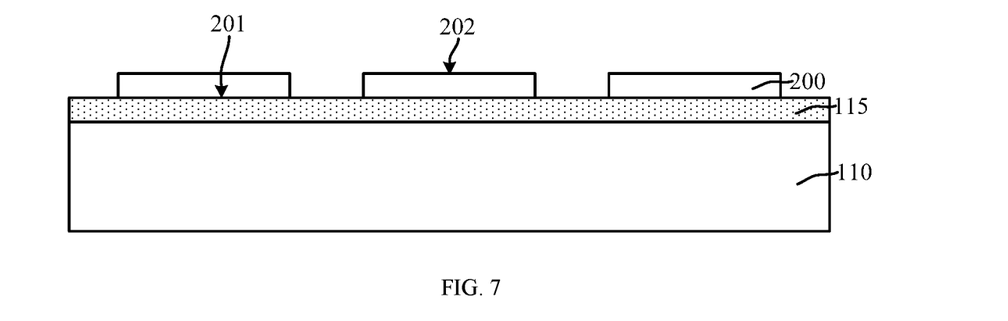
Figure 8:
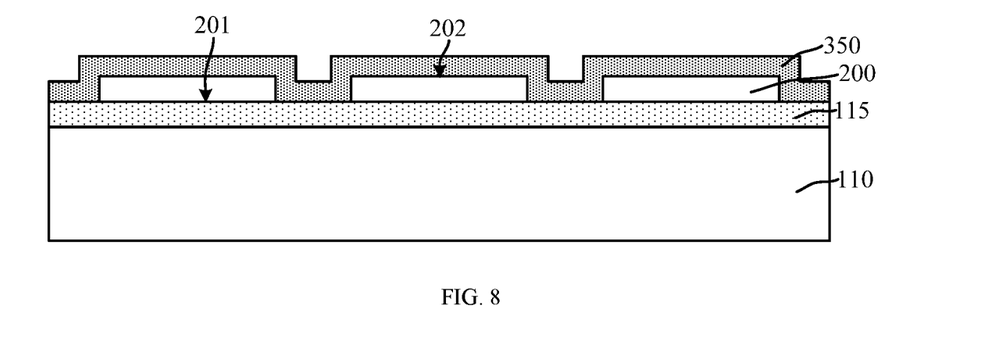
Figure 9:
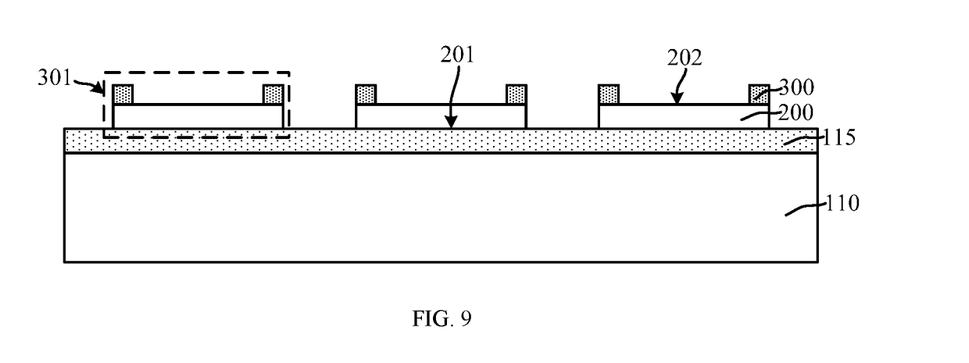
Figure 10:
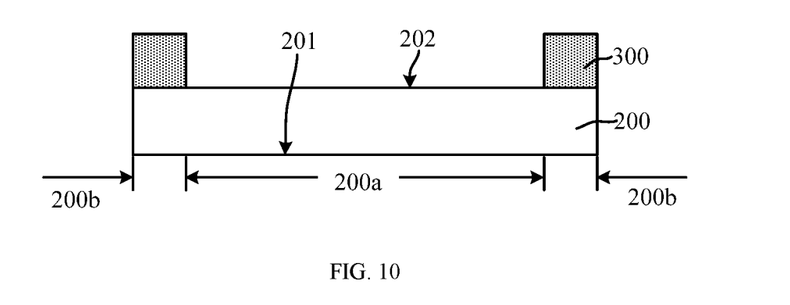

Referring to FIGS. 4-10, where FIG. 5 shows an enlarged view of a transparent cover plate shown in FIG. 4, and FIG. 10 shows an enlarged view of the structure in a broken-line frame 301 of FIG. 9, a transparent cover plate 200 (referring to FIG. 4) may be provided.

After attaching the transparent cover plate 200 to the photosensitive chip 400 (referring to FIG. 2) in a subsequent process, the photosensitive functional surface 411 (referring to FIG. 3) of the photosensitive chip 400 may face the transparent cover plate 200, such that the imaging region of the photosensitive chip 400 may be prevented from being contaminated during the subsequent packaging process. Correspondingly, adverse influence on the performance of the photosensitive chip 400 may be prevented, which may further improve the imaging quality of the subsequently-formed lens module.

In one embodiment, the transparent cover plate 200 may be an IR filter. For example, the transparent cover plate 200 may be an infrared-radiation cut filter (IRCF). The transparent cover plate 200 may also be used to eliminate the influence of IR in the incident light on the performance of the photosensitive chip 400, preventing the photosensitive chip 400 from having problems such as color shift, etc. Therefore, the transparent cover plate 200 may be conducive to improving the image resolution and color reproduction, and thus may improve the imaging effect.

In one embodiment, the transparent cover plate 200 may be a blue-glass IRCF. Adopting the blue-glass IRCF may be conducive to improving the transmission rate of the external incident light. In addition, a plurality of lenses may be disposed in the lens module. In one embodiment, benefiting from the IR absorption characteristics of the blue-glass IRCF, interference of the reflection light may be avoided, which may prevent multiple reflections of light caused by the plurality of lenses from forming bright spots or ghosts. Therefore, besides filtering out IR, the application of the blue-glass IRCF may also be conducive to further improving the imaging effect.

Therefore, the transparent cover plate 200 may include a filter back side 202 (referring to FIG. 5) facing to the photosensitive chip 400, and a filter front side 201 (referring to FIG. 5) in opposite to the filter back side 202. When the transparent cover plate 200 is a blue-glass IRCF, a surface of the blue-glass IRCF, for example, the filter back side 202, may be coated with a transmission-enhancement film or an anti-reflection film (not shown), and accordingly, the surface of the blue-glass IRCF that is in opposite to the transmission-enhancement film or the anti-reflection film may be the filter front side 201. In other embodiments, the IRCF may include a glass and an IR cut coating disposed on the surface of the glass. Therefore, the surface of the IR cut coating may be the filter front side, and the surface of the glass without the IR cut coating may be the filter back side.

Figure 11:
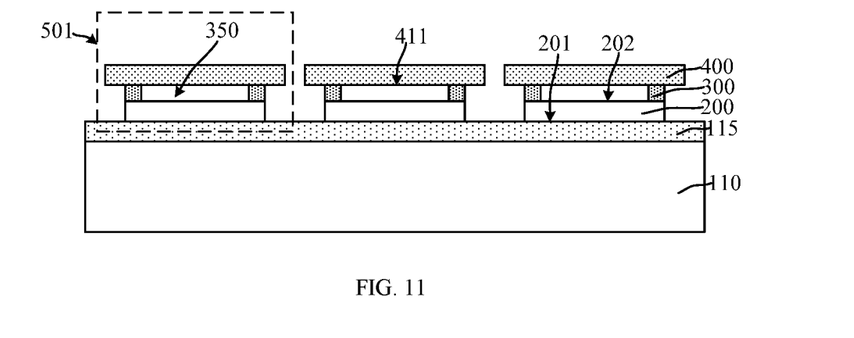
Figure 12:
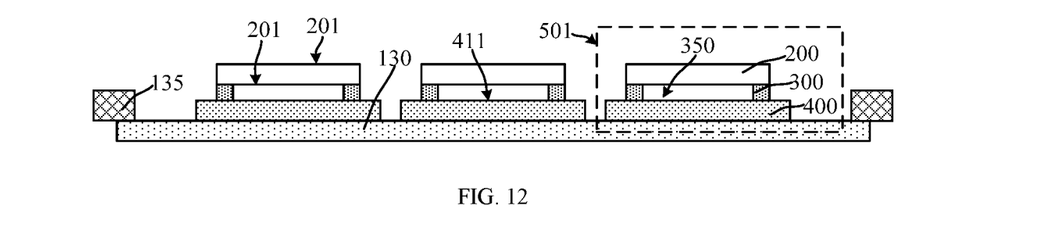
Figure 13:
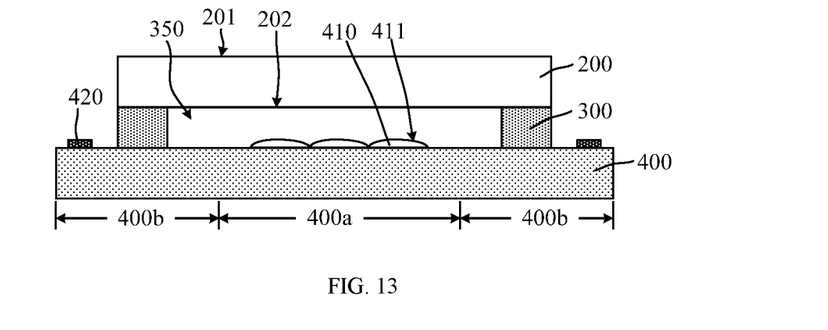

Referring to FIGS. 11-13, where FIG. 13 shows an enlarged view of the structure in the broken-line frame 501 of FIG. 12, the transparent cover plate 200 may be attached to the photosensitive chip 400 through a bonding layer 300. The bonding layer 300 may be located in the peripheral region 400b (referring to FIG. 3), and the transparent cover plate 200, the bonding layer 300, and the photosensitive chip 400 may together enclose a cavity 350 for accommodating the photosensitive region 400a.

The bonding layer 300 may be used to realize the physical connection between the photosensitive chip 400 and the transparent cover plate 200. Compared to a method in which the transparent cover plate is fixed in a groove of the VCM holder, by attaching the transparent cover plate 200 to the photosensitive chip 400, the disclosed method may be able to reduce the overall thickness of the formed lens module, and thus may meet the requirements for miniaturizing and thinning the lens module.

In one embodiment, the bonding layer 300 may be disposed in the peripheral region 400b of the photosensitive chip 400 and may surround the photosensitive functional surface 411. Therefore, the transparent cover plate 200, the photosensitive chip 400 and the bonding layer 300 may together enclose a cavity 350. Correspondingly, the photosensitive chip 400 of the photosensitive chip 400 may be located in the cavity 350, thereby preventing the subsequent packaging process from causing contamination in the imaging region. As such, the disclosed lens module may be conducive to improving the reliability of the lens module.

It should be noted that because a plurality of soldering pad 420 is formed in the peripheral region 400b, in order to avoid affecting the electrical connection between the plurality of soldering pads 420 and external circuits, the bonding layer 300 may be disposed in a portion of the peripheral region 400b that is on the side of the soldering pads 420 that is close to the photosensitive region 400a, such that the plurality of soldering pads 420 may be located outside of the cavity 350.

In one embodiment, the sidewall of the bonding layer 300 may be leveled with the sidewall of the transparent cover plate 200, which may be conducive to reducing the process difficulty of subsequent formation of the sealing layer, and thus improve the coverage ability of the sealing layer.

Figure 14:
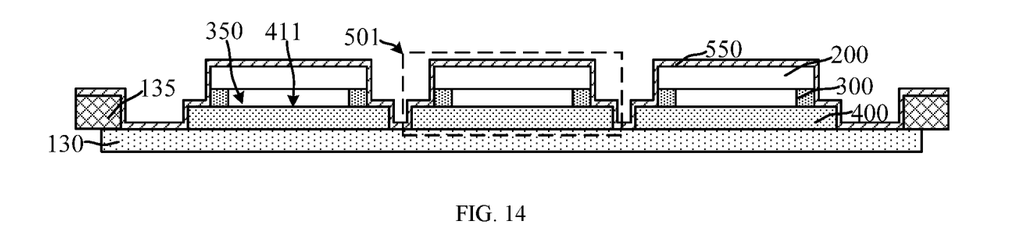
Figure 15:
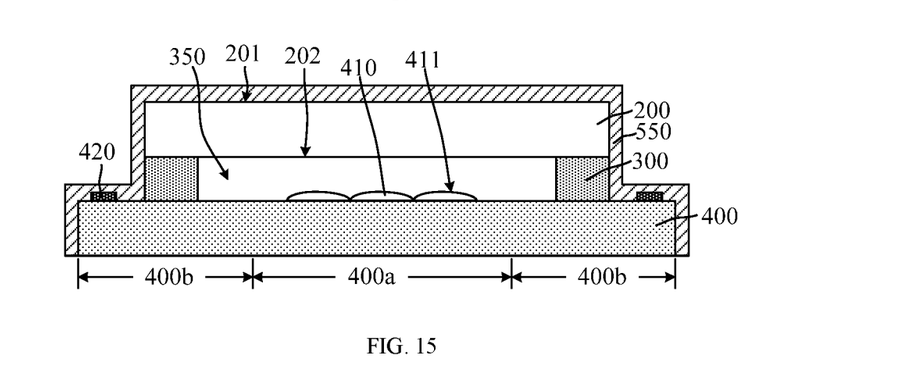
Figure 16:
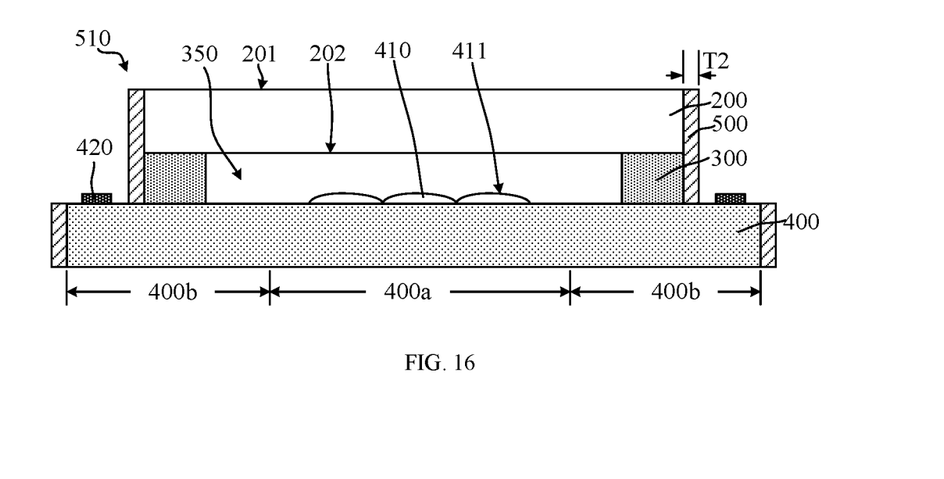

Referring to FIGS. 14-16, where FIG. 15 shows an enlarged view of the structure in the broken-line frame 502 of FIG. 14, and FIG. 16 shows a schematic view of the structure shown in FIG. 15, a sealing layer 500 (referring to FIG. 16) may be formed to at least cover the sidewall of the bonding layer 300 and the sidewall of the transparent cover plate 200.

The sealing layer 500, the photosensitive chip 400, the transparent cover plate 200, and the bonding layer 300 may be used to form a photosensitive assembly 510 (referring to FIG. 16), and thus may provide a process basis for the subsequent packaging process.

The sealing layer 500 may be beneficial to improving the effect for sealing the cavity 350. In a subsequent packaging process, liquid, e.g. water, may be prevented from entering the cavity 350 through the contact interface between the bonding layer 300 and the photosensitive chip 400 and/or through the contact interface between the bonding layer 300 and the transparent cover plate 200. As such, the waterproof performance of the photosensitive assembly 510 may be improved. Correspondingly, the reliability and the yield of the packaging process may be improved, which in turn may improve the reliability of the lens module.

Therefore, the thickness T2 (referring to FIG. 16) of the sealing layer 500 disposed on the sidewalls of the bonding layer 300 and the transparent cover plate 200 may not be too small, otherwise the sealing effect on the cavity 350 may be easily reduced. However, the thickness T2 may not be too large, otherwise the size of the photosensitive assembly 510 may be increased, such that the installation of the photosensitive assembly 510 in the holder may be affected, making it difficult to meet the demands for miniaturization of the lens module. Thus, in one embodiment, the thickness T2 of the sealing layer 500 disposed on the sidewalls of the bonding layer 300 and the transparent cover plate 200 may be in a range of approximately 10 Å to 500 Å, e.g. 50 Å, 100 Å, 300 Å, 500 Å, etc.

In one embodiment, the sealing layer 500 may cover the sidewall of the bonding layer 300 and the sidewall of the transparent cover plate 200. That is, the filter front side 201 of the transparent cover plate 200 and the plurality of soldering pads 420 may not be covered by the sealing layer 500. As such, not only the influence on the optical performance of the transparent cover plate 200 and the photosensitive chip 400 may be reduced, but also the difficulty of a subsequent process for making electrical connections may be reduced, and the process steps may be simplified.

The sealing layer 500 may be made of perfluorodecyltrichlorosilane (FDTS), tetrahydrooctyltrichlorosilane (FOTS), tetrahydrooctylmethyldichlorosilane (FOMDS), or octadecyltrichlorosilane (OTS).

The contact angle of the surface of the sealing layer 500 made of the material described above may be relatively large (e.g., larger than 100°). Therefore, the sealing layer 500 may have desired hydrophobic performance, and thus can effectively prevent liquid, e.g. water, from entering the cavity 350. At the interface of three phases, i.e., gas, liquid, and solid, the tangent plane at the gas-liquid interface on the liquid side may intersect with the solid-liquid boundary, and the contact angle refers to the angle between the tangent plane at the gas-liquid interface on the liquid side and the solid-liquid boundary. The contact angle is a measure of the degree of wettability. A contact angle greater than 90° represents that the solid surface is hydrophobic, that is, liquid cannot easily wet the solid. Moreover, the larger the contact angle, the greater the hydrophobicity.

Moreover, the material of the sealing layer 500 may have desired thermal stability. At a relatively high temperature (for example, at a high temperature of 300° C.), the material may still have desired and stable hydrophobic performance and adhesive performance for bonding the bonding layer 300 and the transparent cover plate 200. Therefore, when self-heating occurs during the operation of the photosensitive chip 400, the probability that the sealing layer 500 adversely affects the performance of the lens module may be limited.

In one embodiment, the sealing layer 500 may be made of FDTS. The contact angle of FDTS is 115°. Therefore, the hydrophobic performance of FDTS is desired, and thus the effect of improving the waterproof ability of the photosensitive assembly 510 may be evident.

In other embodiments, the sealing layer may not be hydrophobic, but may still have desired sealing and waterproof performance. For example, the sealing layer may be made of an epoxy-based adhesive. The epoxy-based adhesive is an epoxy resin adhesive, and demonstrates water resistance and chemical resistance. In addition, the epoxy-based adhesive has strong adhesive ability and low shrinkage ratio, which may not only ensure the waterproof ability of the photosensitive assembly, but also secure the bonding between the sealing layer and the bonding layer 300 as well as between the sealing layer and the transparent cover plate 200.

In one embodiment, the sealing layer 500 may be formed by a process including the following exemplary steps. At least one surface treatment process may be performed. The surface treatment process may include forming a seal layer 550. The seal layer 550 may conformally cover the top (i.e., the filter front side 201) and the sidewall of the transparent cover plate 200, the sidewall of the bonding layer 300, and the photosensitive chip 400 exposed by the transparent cover plate 200. The surface treatment process may further include using a maskless dry etching process to remove the portion of the seal layer 550 formed on the top of the transparent cover plate 200 and on the photosensitive chip 400. The remaining portion of the seal layer 550 formed on the sidewall of the bonding layer 300 as well as on the sidewall of the transparent cover plate 200 may be retained to serve as the sealing layer 500. Therefore, the surface treatment process may include a deposition step for forming a seal layer 550 and a maskless dry etching step for removing the portion of the seal layer 550 formed on the top of the transparent cover plate 200 and on the photosensitive chip 400.

In one embodiment, the seal layer 550 may be formed through a molecular vapor deposition (MVD) process. The MVD process refers to the deposition and modification of the surface of a material by gas phase deposition of functionalized organic molecules. Depending on the material, MVD films can be used as hydrophobic, hydrophilic, biocompatible, protective, or reactive coatings to achieve different functions.

In one embodiment, the self-assembly film-forming process may be performed by the MVD process, such that the seal layer 550 may be formed. Through the MVD process, the seal layer 550 may be formed in a molecular-layer form, which may demonstrate advantages in reducing the thickness of the seal layer 550 and improving the thickness uniformity on a same surface.

In one embodiment, after placing the bonded photosensitive chip 400 and the transparent cover plate 200 into the chamber for the MVD process, a self-assembly monolayer (SAM) film precursor together with water vapor may be introduced into the chamber to form the sealing layer 500.

The water vapor may be used as a catalyst to promote the progress of the deposition process. Taking FDTS as the material of the seal layer 550 as an example for illustration, according to the formula: $SiCl_3H_4C_{10}F_{17}+3H_2O \rightarrow Si(OH)_3H_4C_{10}F_{17}+3HCl$. After introducing an FDTS precursor and water vapor into the chamber, the water vapor may cause the FDTS precursor to hydrolyze, as such the seal layer 550 may be formed on the filter front side 201, the sidewall of the transparent cover plate 200, the sidewall of the bonding layer 300, and the surface of the photosensitive chip 400 that is exposed by the transparent cover plate 200.

The process time for the MVD process may not be too short or too long. Because the transparent cover plate 200, the bonding layer 300, and the photosensitive chip 400 are made of different materials, the formation speed of the seal layer 550 on the transparent cover plate 200, the bonding layer 300, and the photosensitive chip 400 may also be different. Therefore, when the process time is too short, the seal layer 550 may not be formed continuously, and even may be difficult to form in part of the region, which may be detrimental to improving the waterproof ability of the photosensitive assembly 510. When the process time is too long, the excessively long process time, however, may cause unnecessary waste of process resources and production costs. Therefore, in one embodiment, the process time for the MVD process may be in a range of approximately 15 minutes to 60 minutes. As such, the filter front side 201, the sidewall of the transparent cover plate 200, the sidewall of the bonding layer 300, and the surface of the photosensitive chip 400 exposed by the transparent cover plate 200 may all be covered by the seal layer 550, and the seal layer 550 may demonstrate the desired coverage. For example, the process time for the MVD process may be 5 minutes, 10 minutes, 15 minutes, etc.

Similarly, considering the formation speed of the seal layer 550 on the transparent cover plate 200, the bonding layer 300, and the photosensitive chip 400 may be different, the process temperature of the MVD process may not be too low or too high. When the process temperature is too low, the formation speed of the seal layer 550 may be reduced, and thus given a certain process time, the seal layer 550 may not be continuously formed, and even may be difficult to form in part of the region. When the process temperature is too high, adverse effects on the performance of the photosensitive chip 400 may be easily introduced. Therefore, in one embodiment, the process temperature of the MVD process may be in a range of approximately 20° C. to 100° C. As such, the filter front side 201, the sidewall of the transparent cover plate 200, the sidewall of the bonding layer 300, and the surface of the photosensitive chip 400 exposed by the transparent cover plate 200 may all be covered by the seal layer 550, and the seal layer 550 may demonstrate the desired coverage. For example, the process temperature of the MVD process may be 50° C., 70° C., 90° C., 100° C., etc.

In one embodiment, the process time and the process temperature may properly match each other to ensure the formation quality and the covering effect of the seal layer 550 on the transparent cover plate 200, the bonding layer, and the photosensitive chip 200, especially on the sidewalls of the transparent cover plate 200 and the bonding layer 300.

It should be noted that in other embodiments, according to the actual needs, the process temperature of the self-assembly film-formation process may be lower than 20° C.

In one embodiment, after forming the seal layer 550, a maskless dry etching process may be performed to remove the portion of the seal layer 550 formed on the top of the transparent cover plate 200 and the photosensitive chip 400. The remaining portion of the seal layer 550 formed on the sidewall of the bonding layer 300 as well as on the sidewall of the transparent cover plate 200 may be retained to serve as the sealing layer 500.

The dry etching process demonstrates anisotropic etching characteristics, and under the maskless condition, the portion of the seal layer 550 formed on the top of the transparent cover plate 200 and the photosensitive chip 400 exposed by the transparent cover plate 200 may be etched and removed. The portion of the seal layer 550 formed on the sidewall of the bonding layer 300 as well as on the sidewall of the transparent cover plate 200 may be retained.

In one embodiment, the portion of the seal layer 550 formed on the sidewall of the photosensitive chip 400 may also be retained, but the influence on the process may be insignificant. Therefore, no extra etching process may be required to remove the portion of the seal layer 550 formed at the position.

In one embodiment, the dry etching process may be a plasma etching process such that the etch rate may be improved.

An MVD step and an etching step may together constitute a surface treatment process. The surface treatment process may be performed once or may be performed multiple times.

In one embodiment, the surface treatment process may be performed twice. That is, after a first etching step, another deposition step and another etching step may be sequentially performed.

During the dry etching process, the portion of the seal layer 550 formed on the sidewall of the bonding layer 300 and the sidewall of the transparent cover plate 200 may be partially consumed, causing the seal layer 550 in part of the region (for example, the seal layer 550 formed on the sidewall of the transparent cover plate 200 in part of the region that is close to the filter front side 201) to be removed. By performing another deposition step, the loss of the seal layer 550 in the region may be compensated. As such, the formation quality and the coverage effect of the sealing layer 500 subsequently-formed on the sidewall of the bonding layer 300 and the sidewall of the transparent cover plate 200 may be improved.

In one embodiment, because of the process characteristics of the MVD process, during the second deposition step, the region in which the seal layer 550 has been formed will not be covered by another layer of the seal layer 550. Therefore, although the surface treatment process are performed two times, the thickness T2 of the sealing layer 500 formed on the sidewall of the bonding layer 300 and the sidewall of the transparent cover plate 200 may still meet the process requirements.

Increasing the times that the surface treatment process is performed may be conducive to improving the coverage effect of the sealing layer 500 on the sidewall of the bonding layer 300 and the transparent cover plate 200. However, the surface treatment process may not be performed too many times. When the times that the surface treatment process is performed is too large, the packaging efficiency may be reduced. In addition, the transparent cover plate 200 and the photosensitive chip 400 may be significantly affected by the etching process, which may easily cause etching damages to the transparent cover plate 200 and the photosensitive chip 400. Therefore, in one embodiment, the performing time of the surface treatment process may be smaller than or equal to 8.

It should be noted that in other embodiments, according to the actual needs, the surface treatment process may be performed only once. As such, the process cost, may be reduced, and the packaging efficiency may be improved.

That is, in one embodiment, the performing time of the surface treatment process may be in a range of approximately 1 to 8.

In other embodiments, the seal layer may be formed through a spin-coating process. When the spin-coating process is adopted, as the surface treatment process is performed more times, the thickness of the seal layer formed on the sidewall of the bonding layer and the sidewall of the transparent cover plate may increase correspondingly. Therefore, when the surface treatment process is performed multiple times, the thickness of the seal layer formed during each deposition step may need to be reduced, such that after performing the surface treatment process multiple times, the thickness of the sealing layer formed on the sidewall of the bonding layer and the sidewall of the transparent cover plate may still meet the process requirements. For example, the thickness of the sealing layer formed on the sidewall of the bonding layer and the sidewall of the transparent cover plate may have a preset value of t1, the surface treatment process may be performed for n time, and the thickness of the seal layer formed in each deposition step may be t2, and thus $t2=t1/n$.

Further, referring to FIGS. 2-13, it should be noted that during the step for bonding the transparent cover plate 200 (referring to FIG. 13) and the photosensitive chip 400 (referring to FIG. 13), the bonding layer 300 may be formed in the peripheral region 400b (referring to FIG. 3) of the photosensitive chip 400, or may be formed on the filter back side 202 (referring to FIG. 13) of the transparent cover plate 200.

In the following, with reference to the accompany drawings, the step for bonding the transparent cover plate 200 and the photosensitive chip 400 will be described in detail by taking the bonding layer 300 formed on the filter back side 202 as an example.

Referring to FIG. 2 and FIG. 3, the photosensitive chips 400 are usually made through a semiconductor manufacturing process. Therefore, the number of the photosensitive chips may be multiple. Moreover, the plurality of photosensitive chips 400 may be obtained by scribing a device wafer (not shown) integrated with a plurality of photosensitive chips 400.

Correspondingly, prior to scribing the device wafer, the fabrication process may also include performing a film-pasting process to attach a first ultraviolet-rays (UV) film 120 (referring to FIG. 2) to the surface of the device wafer that faces away from the photosensitive functional surface 411. The first UV film 120 may be used to position the device wafer that is integrated with the plurality of photosensitive chips 400, and thus improve the cutting precision. In addition, the first UV film 120 may also be able to fix and position the plurality of photosensitive chips 400.

In one embodiment, the first UV film 120 may be attached to the surface of the device wafer using a film coater. The first UV film 120 may also be attached to the bottom of a first frame 125 (referring to FIG. 2) which has a diameter larger than that of the device wafer. Through the first frame 125, the first UV film 120 may be stretched, which may facilitate the implementation of subsequent processes. The detailed descriptions of the first UV film 120 and the first frame 125 will not be repeated herein again.

Further, referring to FIGS. 4-5, a transparent cover plate 200 may be provided. The transparent cover plate 200 may include a transparent region 200a and a boundary region 200b surrounding the transparent region 200a.

After forming a lens module in a subsequent process, the transparent region 200a may be used to allow the external light to pass through, such that the photosensitive chip (referring to FIG. 3) may be able to receive optical signals, ensuring the normal operation function of the lens module. The boundary region 200b may be used to reserve a space for subsequently bonding the transparent cover plate 200 and the photosensitive chip 400.

The dimension of the transparent cover plate 200 may be determined according to the dimension of the photosensitive chip 400. Usually, the dimension of the transparent cover plate 200 may be smaller than the dimension of the photosensitive chip 400. In one embodiment, the transparent region 200a and the photosensitive region 400a (referring to FIG. 3) may be arranged in opposite to each other, the boundary region 200b and the peripheral region 400b (referring to FIG. 3) may be arranged in opposite to each other, and the dimension of the transparent region 200a may be larger than the dimension of the photosensitive region 400a.

In one embodiment, in order to improve the process operability and the packaging efficiency, a plurality of transparent cover plates 200 may be disposed. The plurality of transparent cover plates 200 may be obtained by cutting a filter mother board (not shown). Correspondingly, the filter back sides of the plurality of transparent cover plates 200 may be attached to a second UV film 100 (referring to FIG. 4). The second UV film 100 may also be attached on the bottom of a second frame 105 which has a diameter larger than that of the filter mother board. The detailed descriptions of the second UV film 100 and the second frame 105 will not be repeated herein again.

Figure 6:
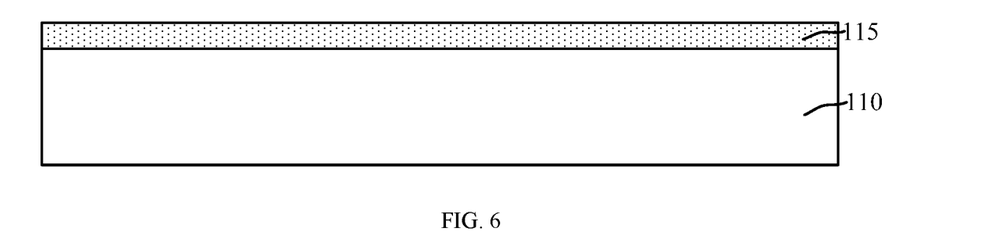

In one embodiment, to improve the operability of the subsequent process, the packaging method may further include the following exemplary steps:

Referring to FIGS. 6-7, providing a carrier substrate 110; and temporarily bonding the filter front side 201 of the transparent cover plate 200 to the carrier substrate 110.

The carrier substrate 110 may be used to provide a process platform for subsequent formation of a bonding layer. In addition, the carrier substrate 110 may also be used to provide support for the transparent cover plate 200 during the subsequent packaging process. As such, the process operability of the subsequent packaging process may be improved. Moreover, through temporary bonding, it may also be convenient to separate the transparent cover plate 200 and the carrier substrate 110 in a subsequent process. In one embodiment, the carrier substrate 110 may be a carrier wafer. In other embodiments, the carrier substrate may be any other appropriate type of substrate.

In one embodiment, the filter front side 201 may be temporarily bonded to the carrier substrate 110 through an adhesive layer 115. The adhesive layer 115 may act as a peeling layer to facilitate the separation of the transparent cover plate 200 and the carrier substrate 110 in a subsequent process.

In one embodiment, the adhesive layer 115 may be formed on either surface of the carrier substrate 110 through a lamination process. As such, the adhesive layer 115 may be attached to one of the surfaces of the carrier substrate 110 without generating bubbles, further reducing the probability for the transparent cover plate 200 to peel off.

In one embodiment, the adhesive layer 115 may be a foamed film. The foamed film may include a micro-adhesive surface and a foamed surface. The foamed film may demonstrate adhesive ability at room temperature. After the foamed surface is attached to the carrier substrate 110, the foamed surface may lose the adhesive property when the foamed film is heated in a subsequent process. As such, the transparent cover plate 200 and the carrier substrate 110 may be separated from each other. In some other embodiments, the adhesive layer may be a die attach film (DAF). Alternatively, the filter front side may be bonded to the carrier substrate through electrostatic bonding.

In one embodiment, by using UV light to irradiate the second UV film 100 (referring to FIG. 4) at the position of a single transparent cover plate 200, the second UV film 100 irradiated by the UV light may lose adhesive ability. By using an ejector pin to individually lift each transparent cover plate 200, the plurality of transparent cover plates 200 may be sequentially peeled off from the second UV film 100. Further, the filter front side 201 of the transparent cover plate 200 may be temporarily bonded to the carrier substrate 110. In one embodiment, sequentially bonding the plurality of transparent cover plate 200 to the carrier substrate 110 may be conducive to improving the position accuracy of the transparent cover plate 200 on the carrier substrate 110.

After the filter front side 201 is temporarily bonded to the carrier substrate 110, the filter back side 202 of the transparent cover plate 200 may be exposed, thus preparing for subsequent formation of the bonding layer.

In one embodiment, a filter mother board may be cut into a plurality of transparent cover plates 200, and the plurality of transparent cover plates 200 may then be sequentially bonded to the carrier substrate 110. In other embodiments, the filter mother board may be bonded to the carrier substrate 110 first, and then the filter mother board may be cut to achieve the wafer-level bonding effect.

Referring to FIGS. 8-10, where FIG. 10 shows an enlarged view of the structure in the broken-line frame 301 of FIG. 9, after the completion of the temporary bonding step, a ring-shaped bonding layer 300 (referring to FIG. 9 or FIG. 10) may be formed in the boundary region 200b (referring to FIG. 5) of the transparent cover plate 200.

In one embodiment, the bonding layer 300 may be formed by a process including the following exemplary steps. A bonding material layer 350 (referring to FIG. 8) may be formed on the filter back side 202. The bonding material layer 350 may be patterned through a photolithography process. The remaining portion of the bonding material layer 350 formed in the boundary region 200b may become the bonding layer 300.

In one embodiment, the bonding material layer 350 may be formed through a spin-coating process. Therefore, the bonding material layer 350 may also cover the sidewall of the transparent cover plate 200 and the adhesive layer 115.

In one embodiment, the bonding layer 300 may be made of a photolithographic material, and thus the bonding material layer 350 can be patterned through a photolithography process. Therefore, any additional etching process may be avoided. As such, the disclosed method may not only be conducive to simplifying the steps of the patterning process, improving the topography quality and the dimensional accuracy of the bonding layer 300, and improving the packaging efficiency and production capacity, but also reduce the influence on the bonding strength of the bonding material layer 350, which is conducive to improving the performance of the physical connection subsequently formed between the transparent cover plate 200 and the photosensitive chip 400 (referring to FIG. 3).

In one embodiment, the bonding layer 300 may be a photolithographic dry film. In other embodiments, the bonding layer may be made of photolithographic polyimide, photolithographic polybenzoxazole (PBO), or photolithographic benzocyclobutene (BCB).

Correspondingly, referring to FIG. 11, the photosensitive functional surface 411 and the filter back side 202 may be arranged in opposite to each other, and the peripheral region 400b (referring to FIG. 3) of the photosensitive chip may be attached to the bonding layer 300.

Because the bonding layer 300 surrounds the transparent region 200a (referring to FIG. 10), after the peripheral region 400b is attached to the bonding layer, the bonding layer 300 may surround the photosensitive region 400a of the photosensitive chip 400.

In one embodiment, the transparent cover plate 200 may be temporarily bonded to the carrier substrate 100. Therefore, in order to improve the process operability, the photosensitive chip 400 may be placed on the bonding layer 300 in a reversed manner such that the photosensitive functional surface 411 faces the bonding layer 300.

In one embodiment, after the plurality of photosensitive chips 400 are sequentially peeled off from the first UV film 120 (referring to FIG. 2), the plurality of photosensitive chips 400 may be reversibly placed on the bonding layer 300 in a one-by-one manner. According to the disclosed method, sequentially placing the plurality of photosensitive chips on the bonding layer 300 may be conducive to improve the accuracy of the relative positions of the photosensitive chip 400 and the transparent cover plate 200.

The step for separating the photosensitive chip 400 and the first UV film 120 may be referred to the corresponding description provided above, and will not be repeated herein.

In one embodiment, after a device wafer that is integrated with photosensitive chips 400 is cut to obtain a plurality of discrete photosensitive chips 400, the plurality of photosensitive chips 400 may then be sequentially bonded to the transparent cover plate 200. In other embodiments, the device wafer that is integrated with a plurality of photosensitive chips 400 may be bonded to the transparent cover plate, and then the device wafer may be cut to achieve the wafer-level bonding effect.

In one embodiment, the bonding layer 300 may be a photolithographic dry film. Therefore, after the plurality of photosensitive chips 400 is reversibly placed on the bonding layer 300, a thermal compression bonding process may be adopted to achieve the bonding between the photosensitive chip 400 and the transparent cover plate 200. The thermal compression bonding process may include a pressing process and a heating process. The thermal compression bonding process may be suitable for a bonding material that exhibits certain bonding ability only under heating conditions. During the heating process of the thermal compression bonding process, the bonding layer 300 may be softened so that the bonding layer 300 may demonstrate desired bonding ability. As such, during the pressing process, the plurality of photosensitive chips 400 may be bonded to the transparent cover plates 200. In other embodiments, a pressure bonding process may be used to bond the photosensitive chip to the transparent cover plate, that is, the bonding of the photosensitive chip and the transparent cover plate may be achieved by applying a pressure.

It should be noted that during the formation of the transparent cover plate 200, the dimension of the transparent cover plate 200 may be properly preset according to the dimension of the photosensitive chip 400. In addition, the region of the filter back side 202 covered by the bonding layer 300 may be properly controlled. As such, after attaching the transparent cover plate 200 to the photosensitive chip 400, the bonding layer 300 may be located in the peripheral region 400b on the side of the plurality of soldering pads 420 that is close to the photosensitive region 400a (referring to FIG. 3).

It should also be noted that in other embodiments, the bonding layer may be formed in the peripheral region of the photosensitive chip.

Further, referring to FIGS. 12-13, the surface of the photosensitive chip 400 that faces away from the photosensitive functional surface 411 may be temporarily bonded to a third UV film 130. After the completion of the temporary bonding step, a de-bonding process may be performed on the transparent cover plate 200 and the carrier substrate 110 (referring to FIG. 11), such that the carrier substrate 110 may be removed.

By temporarily bonding the surface of the photosensitive chip 400 that faces away from the photosensitive functional surface 411 to the third UV film 130, a process platform may thus be provided for the formation of the sealing layer 500 (referring to FIG. 16). In addition, after forming the photosensitive assembly 510 (referring to FIG. 16), the temporary bonding may facilitate the installation of individual photosensitive assembly 510 and the lens assembly. Because an UV film may have degraded adhesive ability under the irradiation of UV light, in a subsequent process, by using UV light to irradiate on the third UV film 130, the photosensitive chip 400 and the third UV film 130 may be separated. In addition, the probability of having UV film residue may be low. Therefore, the process may be simple and the process risk may be low.

Therefore, the third UV film 130 may be attached to the surface of the plurality of photosensitive chips 400 that faces away from the photosensitive functional surface 411, and may also be attached to the bottom of a third frame 135 which has a relatively large diameter. The third UV film 130 and the third frame 135 may be arranged in a similar way as the first UV film 120 and the first frame 125, and for more details, reference may be made to the corresponding description provided above. In other embodiments, according to the actual process needs, another type of carrier substrate may be used to replace the third UV film. For example, the carrier substrate may be a carrier wafer.

After the completion of the temporary bonding step, through the de-bonding process, the filter front side 201 of the transparent cover plate 200 may be exposed, thus preparing for the formation of the sealing layer 500.

For example, a heating process may be performed on the foamed film so that the foamed surface of the foamed film may lose adhesive ability. As such, the carrier substrate 110 may be removed. Further, the adhesive layer 115 (referring to FIG. 11) may be subsequently removed by tearing.

Therefore, referring to FIG. 14, the third UV film 130 and the third frame 135 may also be exposed in the process environment for forming the seal layer 550. As such, after the formation of the seal layer 550, the seal layer 550 may also cover the third UV film 130 and the third frame 135 exposed by the seal layer 550.

Correspondingly, through a maskless dry etching process, the portion of the seal layer 550 formed on the third frame 135 and the third UV film 130 may be etched and removed. The portion of the seal layer 550 formed on the sidewall of third frame 135 may be retained. However, in a subsequent process, the photosensitive chip 400 may be peeled off from the third UV film. Therefore, the seal layer 550 formed on the sidewall of the third frame may not be able to affect the photosensitive assembly 510.

Figure 17:
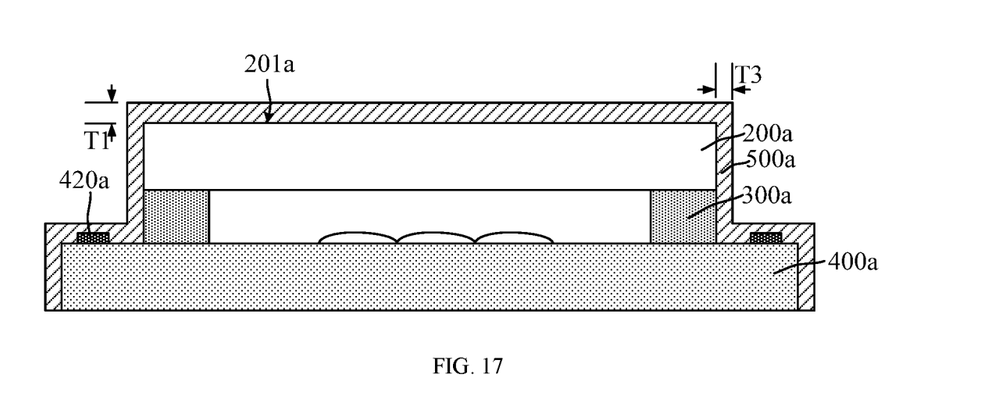
FIG. 17 illustrates a schematic cross-sectional view of a structure corresponding to another exemplary method for forming a photosensitive assembly according to various embodiments of the present disclosure.

FIG. 17 illustrates a schematic cross-sectional view of a structure corresponding to another exemplary method for forming a photosensitive assembly according to various embodiments of the present disclosure.

For the method illustrated in FIG. 17, the aspects that are the same or similar to the embodiments described above will not be described herein again. The method illustrated in FIG. 17 may be different from that described above in the following aspects: the sealing layer 500a may conformally cover the top (i.e., the filter front side) and the sidewall of the transparent cover plate 200a, the sidewall of the bonding layer 300a, and the photosensitive chip 400a exposed by the transparent cover plate 200a.

By forming the sealing layer 500a to conformally cover the top and the sidewall of the transparent cover plate 200a, the sidewall of the bonding layer 300a, as well as the photosensitive chip 400a exposed by the transparent cover plate 200a, the sealing layer 500a may also be able to prevent the top of the transparent cover plate 200a from contacting liquid, e.g. water, during a subsequent packaging process, and play a role in isolating particles, which may be conducive to securing the optical performance of the transparent cover plate 200a. Moreover, an extra process for removing the sealing layer 500a from other regions may be avoided, and thus the process steps may be simplified.

Therefore, the sealing layer 500a may be light transmissive, so that while ensuring the waterproof ability of the photosensitive assembly, the sealing layer 500a may be able to prevent undesired influence on the optical performance of the transparent cover plate 200a. As such, the reliability of the lens module may be further ensured.

In one embodiment, in order to ensure the reliability of the lens module, the light transmittance of the sealing layer 500a may be greater than or equal to 98%.

For example, the sealing layer 500a may be made of FDTS, FOTS, FOMDS, or OTS.

In one embodiment, the sealing layer 500a may be formed through an MVD process. The sealing layer 500a formed through the MVD process may have a small thickness and demonstrate desired thickness uniformity, and thus may correspondingly improve the light transmittance of the sealing layer 500a. In addition, forming the sealing layer 500a through the MVD process may also be able to avoid undesired influence on the subsequent wire bonding process, such that during the wire bonding process, leads may easily penetrate through the sealing layer 500a to electrically connect the soldering pads of the photosensitive chip 400a.

In other embodiments, the sealing layer may be made of a spin-coating process.

In one embodiment, in order to ensure the waterproof ability of the photosensitive assembly, the thickness T3 of the portion of the sealing layer 500a formed on the sidewall of the bonding layer 300a and the sidewall of the transparent cover plate 200a may be in a range of approximately 10 Å to 100 nm.

It should be noted that influenced by the process characteristics, during an actual process, the thickness T1 of the portion of the sealing layer 500a formed on the top of the transparent cover plate 200a may be usually larger than the thickness T3 of the sealing layer 500a formed on the sidewalls of the bonding layer 300 and the transparent cover plate 200. Therefore, the thickness T1 of the portion of the sealing layer 500a formed on the top of the transparent cover plate 200a may not be too small or too large. When the thickness T1 is larger, the light transmittance of the sealing layer 500a may be smaller, and thus the optical performance of the transparent cover plate 200a and the photosensitive chip 400a may be degraded. In addition, the thickness T1 of the portion of the sealing layer 500a formed on the top of the transparent cover plate 200a may be usually equal to the thickness of the portion of the sealing layer 550a formed on the photosensitive chip 400a. When the thickness T1 is excessively large, the difficulty of the subsequent wire bonding process may be easily increased. When the thickness T1 is too small, the thickness T3 of the portion of the sealing layer 500a formed on the sidewalls of the bonding layer 300a and the transparent cover plate 200a may thus be substantially small. As such, the waterproof ability of the photosensitive assembly may be reduced. Therefore, in one embodiment, after forming the sealing layer 500a, the thickness T1 of the portion of the sealing layer 500a on the top of the transparent cover plate 200a may be in a range of approximately 10 Å to 100 Å.

According to the description provided above, during the step for forming the sealing layer 500a, the photosensitive chip 400a may be temporarily bonded on a UV film, and the sealing layer 500a may be able to cover the UV film. However, because the sealing layer 500a may have a small thickness at the corners of the photosensitive chip 400a and the UV film, during a subsequent process for individually peeling off the plurality of photosensitive chips 400a from the UV film, the sealing layer 500a at the corners of the photosensitive chip 400a and the UV film may be easily broken to obtain individual photosensitive assemblies.

In other embodiments, after forming the sealing layer and prior to peeling off the photosensitive chips from the UV film, the sealing layer may be subjected to a laser cutting process to separate the portion of the sealing layer formed on the photosensitive chips from the portion of the sealing layer formed on the UV film.

Correspondingly, the present disclosure also provides a photosensitive assembly. FIG. 16 illustrates a schematic cross-sectional view of a photosensitive assembly according to various embodiments of the present disclosure.

Referring to FIG. 16, the photosensitive assembly 510 may include a photosensitive chip 400, including a photosensitive region 400a (referring to FIG. 3) and a peripheral region 400b (referring to FIG. 3) surrounding the photosensitive region 400a; and a transparent cover plate 200, attached to the photosensitive chip 400 through a bonding layer 300 located in the peripheral region 400b. The transparent cover plate 200, the bonding layer 300, and the photosensitive chip 400 may enclose a cavity 350 for accommodating the photosensitive region 400a. The photosensitive assembly 510 may also include a sealing layer 500. The sealing layer 500 may at least cover the sidewall of the bonding layer 300 and the sidewall of the transparent cover plate 200.

In one embodiment, the photosensitive chip 400 may be a CMOS image sensor chip. In other embodiments, the photosensitive chip may be a CCD image sensor chip.

In one embodiment, the photosensitive chip 400 may have a photosensitive functional surface 411 located in the photosensitive region 400a.

In one embodiment, the photosensitive chip 400 may include a plurality of pixel units, for example, a plurality of red pixel units, a plurality of green pixel units, and a plurality of blue pixel units. Therefore, the photosensitive chip 400 may include a plurality of semiconductor photosensitive devices (not shown) and a plurality of filter films (not shown) disposed on the plurality of semiconductor photosensitive devices. The photosensitive chip 400 may also include a plurality of microlenses 410 (referring to FIG. 3) disposed on the plurality of filter films. Correspondingly, the photosensitive functional surface 411 may refer to the top surface of the plurality of microlenses 410.

It should be noted that the photosensitive chip 400 may include a plurality of soldering pads 420, formed in the peripheral region 400b on the side of the photosensitive functional surface and used to electrically connect the photosensitive chip 400 to external circuits.

In one embodiment, the transparent cover plate 200 may be located above the photosensitive chip 400, and the transparent cover plate 200 may face the photosensitive functional surface 411 for preventing the packaging process from causing contamination on the photosensitive functional surface 411. As such, the imaging quality of the lens module may be improved.

In one embodiment, the transparent cover plate 200 may be an IR filter. In the lens module, the transparent cover plate 200 may be used to eliminate the influence of IR in the incident light on the performance of the photosensitive chip 400, preventing the photosensitive chip 400 from having problems such as color shift, etc. For example, the transparent cover plate may be a blue-glass IRCF.

In one embodiment, the transparent cover plate 200 may include a filter back side 203 that faces the photosensitive chip 400, and a filter front side 201 that is in opposite to the filter front side. Detailed description of the transparent cover plate 200 may be referred to the corresponding content in embodiments provided above, and will not be repeated herein.

The bonding layer 300 may be used to realize the physical connection between the photosensitive chip 400 and the transparent cover plate 200. By attaching the transparent cover plate 200 to the photosensitive chip 400, the disclosed photosensitive assembly 510 may be able to reduce the overall thickness of the lens module to meet the requirements for miniaturizing and thinning the lens module.

In one embodiment, the bonding layer may be disposed in the peripheral region 400b and may surround the photosensitive functional surface 411. The transparent cover plate 200, the photosensitive chip 400, and the bonding layer 300 may together enclose a cavity 350 that accommodates the photosensitive region 400a.

Correspondingly, the photosensitive region 400a may be located in the cavity 350 to prevent the packaging process from causing contamination on the photosensitive region 400a, and thus may be conducive to improving the reliability of the lens module. In one embodiment, in order to avoid affecting the electrical connection of the soldering pad 420 to external circuits, the soldering pad 420 may be located outside of the cavity 350.

In one embodiment, the bonding layer 300 may be made of a photolithographic material. Therefore, the bonding layer 300 may be formed through a photolithography process. As such, the process steps for forming the bonding layer 300 may be simplified, the packaging efficiency and the production capacity may be improved. Moreover, the influence on the bonding strength of the bonding layer 300 may be reduced.

In one embodiment, the bonding layer 300 may be a dry film. In other embodiments, the bonding layer may be made of polyimide, PBO, or BCB.

In other embodiments, the sidewall of the bonding layer 300 may be leveled with the sidewall of the transparent cover plate 200. As such, the process difficulty for subsequently forming the sealing layer 500 may be reduced, and the coverage ability of the sealing layer 500 may be improved.

The sealing layer 500 may be conducive to improving the effect for sealing the cavity 350, such that during the packaging process, liquid, e.g. water, may be prevented from entering the cavity 350 through the contact interface between the bonding layer 300 and the photosensitive chip 400 and/or through the contact interface between the bonding layer 300 and the transparent cover plate 200. As such, the waterproof ability of the photosensitive assembly 510 may be improved, and the reliability and the yield of the packaging process may be correspondingly improved, which may in turn improve the reliability of the lens module.

Therefore, the thickness T2 of the sealing layer 500 formed on the sidewalls of the bonding layer 300 and the transparent cover plate 200 may not be too small, otherwise the sealing effect on the cavity 350 may be easily reduced. However, the thickness T2 may not be too large, otherwise the size of the photosensitive assembly 510 may be increased, such that the installation of the photosensitive assembly 510 in the holder may be affected, making it difficult to meet the demands for miniaturization of the lens module. Thus, in one embodiment, the thickness T2 of the sealing layer 500 disposed on the sidewalls of the bonding layer 300 and the transparent cover plate 200 may be in a range of approximately 10 Å to 500 Å, e.g. 50 Å, 100 Å, 300 Å, 500 Å, etc.

In one embodiment, the sealing layer 500 may cover the sidewall of the bonding layer 300 and the sidewall of the transparent cover plate 200. That is, the filter front side 201 of the transparent cover plate 200 and the plurality of soldering pads 420 may not be covered by the sealing layer 500. As such, not only the influence on the optical performance of the transparent cover plate 200 and the photosensitive chip 400 may be reduced, but also the difficulty of a subsequent process for making electrical connections may be reduced, and the process steps may be simplified.

The sealing layer 500 may be made of FDTS, FOTS, FOMDS, or OTS.

The sealing layer 500 may have desired hydrophobic performance, and thus can effectively prevent liquid, e.g. water, from entering the cavity 350. Moreover, the material of the sealing layer 500 may have desired thermal stability. At a relatively high temperature (for example, at a high temperature of 300° C.), the material may still have desired and stable hydrophobic performance and adhesive performance for bonding the bonding layer 300 and the transparent cover plate 200. Therefore, when self-heating occurs during the operation of the photosensitive chip 400, the probability that the sealing layer 500 adversely affects the performance of the lens module may be limited.

In one embodiment, the sealing layer 500 may be made of FDTS. The hydrophobic performance of FDTS is desired, and thus the effect of improving the waterproof ability of the photosensitive assembly 510 may be evident.

In other embodiments, the sealing layer may not be hydrophobic, but may still have desired sealing and waterproof performance. For example, the sealing layer may be made of an epoxy-based adhesive. The epoxy-based adhesive is epoxy resin adhesive, and demonstrates water resistance and chemical resistance. In addition, the epoxy-based adhesive has strong adhesive ability and low shrinkage ratio, which may not only ensure the waterproof ability of the photosensitive assembly and secure the bonding between the sealing layer and the bonding layer 300 as well as between the sealing layer and the transparent cover plate 200, but also reduce the probability that the transparent cover plate 200 breaks due to stress.

It should be noted that the sealing layer 500 may be formed through a process combining deposition and maskless etching. Therefore, the sealing layer 500 may also cover the sidewall of the photosensitive chip 400; however, the influence on the process may be insignificant.

The disclosed photosensitive assembly may be formed by any forming method described in the embodiments provided above. For a detailed description of the formation of the disclosed photosensitive assembly, reference may be made to the corresponding description in the embodiments provided above, which will not be described herein again.

Further, referring to FIG. 17, a schematic cross-sectional view of another exemplary photosensitive assembly according to various embodiments of the present disclosure is illustrated.

For the photosensitive assembly illustrated in FIG. 17, the aspects that are the same or similar to the embodiments described above will not be described herein again. The photosensitive assembly illustrated in FIG. 17 may be different from that described above in the following aspects: the sealing layer 500a may conformally cover the top (i.e., the filter front side) and the sidewall of the transparent cover plate 200a, the sidewall of the bonding layer 300a, and the photosensitive chip 400a exposed by the transparent cover plate 200a.

The sealing layer 500a may be able to prevent the top of the transparent cover plate 200a from contacting liquid, e.g. water, during a subsequent packaging process. In addition, the sealing layer 500a may also play a role in isolating particles, which may be conducive to securing the optical performance of the transparent cover plate 200a. Moreover, the formation of the sealing layer 500a may only include a deposition process, and thus the process steps may be simplified.

Therefore, the sealing layer 500a may be light transmissive, so that while ensuring the waterproof ability of the photosensitive assembly, the sealing layer 500a may be able to prevent undesired influence on the optical performance of the transparent cover plate 200a. As such, the reliability of the lens module may be further ensured. In one embodiment, the light transmittance of the sealing layer 500a may be greater than or equal to 98%.

In one embodiment, in order to ensure the waterproof ability of the photosensitive assembly, the thickness T3 of the portion of the sealing layer 500a formed on the sidewall of the bonding layer 300a and the sidewall of the transparent cover plate 200a may be in a range of approximately 10 Å to 100 nm.

Influenced by the characteristics of the deposition process, the thickness T1 of the portion of the sealing layer 500a formed on the top of the transparent cover plate 200a may be usually larger than the thickness T3 of the sealing layer 500a formed on the sidewalls of the bonding layer 300 and the transparent cover plate 200. Therefore, the thickness T1 of the portion of the sealing layer 500a formed on the top of the transparent cover plate 200a may not be too small or too large. When the thickness T1 is larger, the light transmittance of the sealing layer 500a may be smaller, and thus the optical performance of the transparent cover plate 200a and the photosensitive chip 400a may be degraded. In addition, the thickness T1 of the portion of the sealing layer 500a formed on the top of the transparent cover plate 200a may be usually equal to the thickness of the portion of the sealing layer 550a formed on the photosensitive chip 400a. When the thickness T1 is excessively large, the difficulty of the subsequent wire bonding process may be easily increased. When the thickness T1 is too small, the thickness T3 of the portion of the sealing layer 500a formed on the sidewalls of the bonding layer 300a and the transparent cover plate 200a may thus be substantially small. As such, the waterproof ability of the photosensitive assembly may be reduced. Therefore, in one embodiment, the thickness T1 of the portion of the sealing layer 500a on the top of the transparent cover plate 200a may be in a range of approximately 10 Å to 100 Å.

The disclosed photosensitive assembly may be formed by any forming method described in the embodiments provided above. For a detailed description regarding the disclosed photosensitive assembly, reference may be made to the corresponding description in the embodiments provided above, and the content will not be repeated herein.

Figure 18:
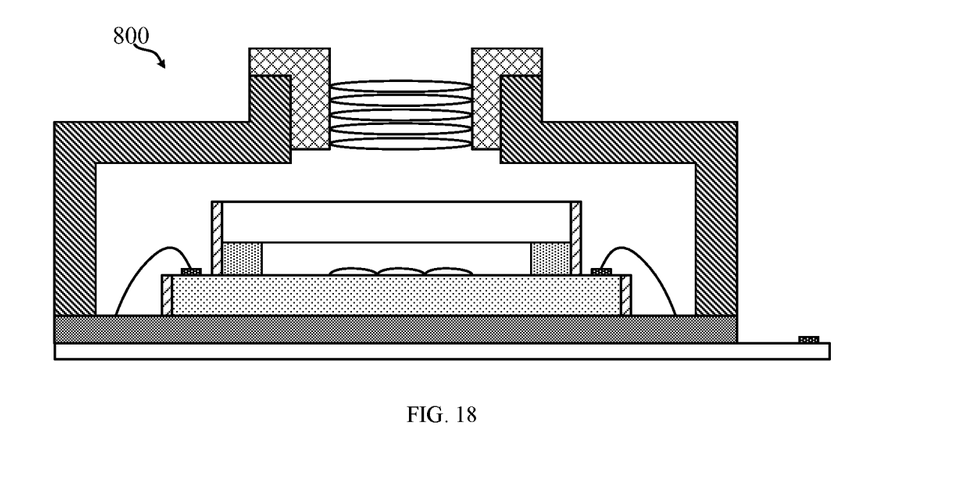
FIG. 18 illustrates a schematic cross-sectional view of an exemplary lens module according to various embodiments of the present disclosure.

Correspondingly, the present disclosure also provides a lens module. Referring to FIG. 18, a schematic cross-sectional view of an exemplary lens module according to various embodiments of the present disclosure is illustrated.

In one embodiment, the lens module 800 may include the photosensitive assembly according to various embodiments of the present disclosure.

According to the disclosed lens module, the formation of a sealing layer in the photosensitive assembly may improve the effect for sealing the cavity, and thus improving the waterproof ability of the photosensitive assembly. During the packaging process for the lens module, liquid, e.g. water, may be effectively presented from entering the cavity, which may improve the reliability of the lens module.

The detailed description of the photosensitive assembly may be referred to the corresponding description in the embodiments provided above, and the content will not be repeated herein.

Figure 19:
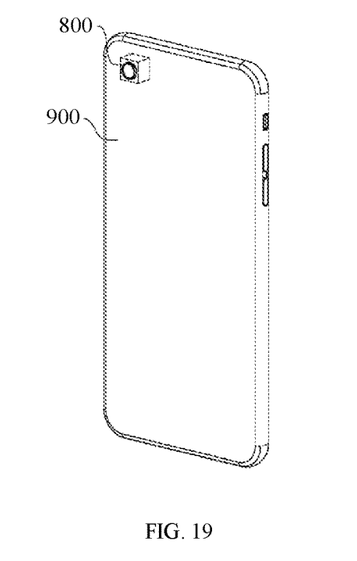
FIG. 19 illustrates a schematic cross-sectional view of an electronic device according to various embodiments of the present disclosure.
Figure 20:
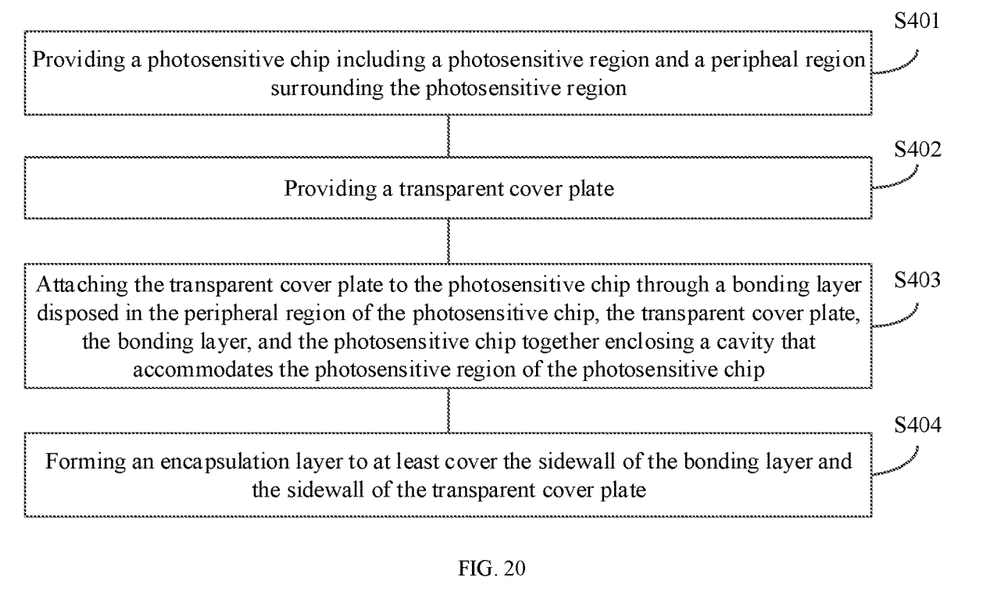
FIG. 20 illustrates a flowchart of an exemplary method for forming a photosensitive assembly according to various embodiments of the present disclosure.

Correspondingly, the present disclosure also provides an electronic device. Referring to FIG. 19, a schematic cross-sectional view of an electronic device according to various embodiments of the present disclosure is illustrated.

In one embodiment, the electronic device 900 may include the lens module 800 according to various embodiments of the present disclosure.

The reliability of the lens module 800 may be high, which may correspondingly improve the imaging quality of the electronic device 900.

In one embodiment, the electronic device 900 may be a mobile phone, a tablet computer, a camera, a camcorder, or any other electronic devices with picture-capturing functions.

Although the present disclosure has been described through the embodiments provided above, the present disclosure is not limited to the embodiments. Those skilled in the art can make various changes and modifications without departing from the spirit and scope of the present disclosure. Therefore, the protection scope of the present invention should be subject to the scope defined by the appended claims and their equivalents.

What is claimed is:

1. A method for forming a photosensitive assembly, comprising:
   providing a transparent cover plate;
   providing a photosensitive chip, including a photosensitive region and a peripheral region surrounding the photosensitive region, wherein the peripheral region includes a plurality of soldering pads;
   bonding the transparent cover plate to the photosensitive chip through a bonding layer located in the peripheral region of the photosensitive chip, wherein the transparent cover plate, the bonding layer, and the photosensitive chip enclose a cavity that accommodates the photosensitive region; and
   forming a sealing layer between the bonding layer and the plurality of soldering pads in the peripheral region to at least cover a sidewall of the bonding layer and a sidewall of the transparent cover plate, wherein the sealing layer has a thickness smaller than a distance between the bonding layer and a corresponding soldering pad.

2. The method according to claim 1, wherein:
   the sealing layer conformally covers a top and the sidewall of the transparent cover plate, the sidewall of the bonding layer, and a portion of the photosensitive chip exposed by the transparent cover plate.

3. The method according to claim 1, wherein:
   the sealing layer is formed through a molecular vapor deposition (MVD) process or a spin-coating process.

4. The method according to claim 3, wherein process parameters adopted in the MVD process include:
   a process time in a range of approximately 15 minutes to 60 minutes; and
   a process temperature in a range of approximately 20° C. to 100° C.

5. The method according to claim 2, wherein:
   the sealing layer is light transmissive.

6. The method according to claim 5, wherein:
   a light transmittance of the sealing layer is greater than or equal to 98%.

7. The method according to claim 6, wherein:
   a thickness of the sealing layer on the sidewall of the bonding layer and the sidewall of the transparent cover plate is in a range of approximately 10 Å to 100 nm.

8. The method according to claim 2, wherein:
   a thickness of the sealing layer on the top of the transparent cover plate is in a range of approximately 10 Å to 100 Å.

9. The method according to claim 8, wherein:
   the sealing layer is made of an epoxy-based adhesive, or one of perfluorodecyltrichlorosilane (FDTS), tetrahydrooctyltrichlorosilane (FOTS), tetrahydrooctylmethyldichlorosilane (FOMDS), and octadecyltrichlorosilane (OTS).

10. A method for forming a photosensitive assembly, comprising:
    providing a transparent cover plate;
    providing a photosensitive chip, including a photosensitive region and a peripheral region surrounding the photosensitive region;
    bonding the transparent cover plate to the photosensitive chip through a bonding layer located in the peripheral region of the photosensitive chip, wherein the transparent cover plate, the bonding layer, and the photosensitive chip enclose a cavity that accommodates the photosensitive region; and
    forming a sealing layer to at least cover a sidewall of the bonding layer and a sidewall of the transparent cover plate, wherein:
       the sealing layer covers the sidewall of the bonding layer and the sidewall of the transparent cover plate; and
       forming the sealing layer includes performing at least one surface treatment process, wherein the surface treatment process includes:
          forming a seal layer to conformally cover a top and the sidewall of the transparent cover plate, the sidewall of the bonding layer, and a portion of the photosensitive chip exposed by the transparent cover plate, and
          performing a maskless dry etching process to remove a portion of the seal layer formed on the top of the transparent cover plate and on the photosensitive chip, wherein a remaining portion of the seal layer formed on the sidewall of the bonding layer and the sidewall of the transparent cover plate serves as the sealing layer.

11. The method according to claim 10, wherein:
    a number of times that the surface treatment process is performed is in a range of approximately 1 to 8.

12. A photosensitive assembly, comprising:
    a photosensitive chip, including a photosensitive region and a peripheral region surrounding the photosensitive region, wherein the peripheral region includes a plurality of soldering pads;
    a transparent cover plate, attached to the photosensitive chip through a bonding layer located in the peripheral region of the photosensitive chip, wherein the transparent cover plate, the bonding layer, and the photosensitive chip together enclose a cavity that accommodates the photosensitive region; and
    a sealing layer between the bonding layer and the plurality of soldering pads in the peripheral region, covering at least a sidewall of the bonding layer and a sidewall of the transparent cover plate, wherein the sealing layer has a thickness smaller than a distance between the bonding layer and a corresponding soldering pad.

13. The photosensitive assembly according to claim 12, wherein:
    the sealing layer conformally covers a top and the sidewall of the transparent cover plate, the sidewall of the bonding layer, and a portion of the photosensitive chip exposed by the transparent cover plate.

14. The photosensitive assembly according to claim 13:
    the sealing layer is light transmissive.

15. The photosensitive assembly according to claim 14, wherein:
    a light transmittance of the sealing layer is greater than or equal to 98%.

16. The photosensitive assembly according to claim 12, wherein:
    a thickness of the sealing layer on the sidewall of the bonding layer and the sidewall of the transparent cover plate is in a range of approximately 10 Å to 100 nm.

17. The photosensitive assembly according to claim 13, wherein:
    a thickness of the sealing layer on the top of the transparent cover plate is in a range of approximately 10 Å to 100 Å.

18. The photosensitive assembly according to claim 12, wherein:
    the sealing layer is made of an epoxy-based adhesive, or one of FDTS, FOTS, FOMDS, and OTS.

19. A lens module, comprising a photosensitive assembly according to claim 12.

20. An electronic device, comprising a lens module according to claim 19.

* * * * *